(12) United States Patent
Hong et al.

(10) Patent No.: US 10,128,322 B2
(45) Date of Patent: Nov. 13, 2018

(54) ORGANIC LIGHT-EMITTING DISPLAY DEVICE INCLUDING CONDUCTIVE LAYER AND MANUFACTURING METHOD THEREOF

(71) Applicant: SAMSUNG DISPLAY CO., LTD., Yongin-si, Gyeonggi-do (KR)

(72) Inventors: Soonmyung Hong, Yongin-si (KR); Kyongtae Park, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/460,636

(22) Filed: Mar. 16, 2017

(65) Prior Publication Data

US 2018/0006098 A1 Jan. 4, 2018

(30) Foreign Application Priority Data

Jul. 4, 2016 (KR) .................. 10-2016-0084094

(51) Int. Cl.
*H01L 27/32* (2006.01)
*H01L 27/12* (2006.01)
*H01L 51/52* (2006.01)

(52) U.S. Cl.
CPC ........ *H01L 27/3258* (2013.01); *H01L 27/124* (2013.01); *H01L 27/1248* (2013.01); *H01L 27/3246* (2013.01); *H01L 27/3248* (2013.01); *H01L 27/3262* (2013.01); *H01L 27/3276* (2013.01); *H01L 2227/323* (2013.01)

(58) Field of Classification Search
CPC .............. H01L 27/3258; H01L 27/124; H01L 27/1248; H01L 27/3246; H01L 27/3248; H01L 27/3262; H01L 27/3276; H01L 2227/323
USPC ....................... 257/40; 438/82, 99
See application file for complete search history.

(56) References Cited

U.S. PATENT DOCUMENTS

| | | |
|---|---|---|
| 8,525,209 B2 | 9/2013 | Jeong |
| 8,717,724 B2 | 5/2014 | Park et al. |
| 2004/0119398 A1* | 6/2004 | Koo .................. H01L 51/5271 313/499 |

(Continued)

FOREIGN PATENT DOCUMENTS

| | | |
|---|---|---|
| KR | 10-2006-0078002 A | 7/2006 |
| KR | 10-2010-0037814 A | 4/2010 |

(Continued)

*Primary Examiner* — Allen Parker
*Assistant Examiner* — Didarul Mazumder
(74) *Attorney, Agent, or Firm* — Lee & Morse P.C.

(57) ABSTRACT

An organic light-emitting display device includes: a substrate; a thin film transistor over the substrate, the thin film transistor including a semiconductor layer and a gate electrode overlapping the semiconductor layer; a conductive layer between the substrate and the semiconductor layer of the thin film transistor; an insulating layer between the conductive layer and the thin film transistor; a passivation layer covering the thin film transistor; a pixel electrode over the passivation layer, the pixel electrode being electrically connected to the thin film transistor via a contact hole defined in the passivation layer; an emission layer over the pixel electrode; and an opposite electrode over the emission layer, the opposite electrode being electrically connected to the conductive layer.

15 Claims, 18 Drawing Sheets

(56) References Cited

U.S. PATENT DOCUMENTS

| | | | |
|---|---|---|---|
| 2007/0235777 A1* | 10/2007 | Nagata | H01L 29/78603 257/288 |
| 2010/0084711 A1 | 4/2010 | Kim et al. | |
| 2011/0204369 A1* | 8/2011 | Ha | H01L 51/5228 257/59 |
| 2014/0315339 A1* | 10/2014 | Kim | H01L 51/56 438/34 |
| 2014/0354142 A1* | 12/2014 | Jeong | H01L 27/3246 313/506 |
| 2014/0374732 A1* | 12/2014 | Jeong | H01L 27/3246 257/40 |
| 2015/0055051 A1 | 2/2015 | Osawa et al. | |
| 2016/0087244 A1* | 3/2016 | Kim | H01L 51/5271 257/40 |
| 2016/0149155 A1* | 5/2016 | Kim | H01L 51/5228 257/40 |
| 2016/0190389 A1* | 6/2016 | Lee | H01L 51/5256 257/93 |
| 2016/0233291 A1 | 8/2016 | Lim et al. | |

FOREIGN PATENT DOCUMENTS

| | | |
|---|---|---|
| KR | 10-2013-0024744 A | 3/2013 |
| KR | 10-2015-0126509 A | 11/2015 |
| KR | 10-2015-0139281 A | 12/2015 |
| KR | 10-2016-0018825 A | 2/2016 |
| KR | 10-2016-0021329 A | 2/2016 |
| WO | WO 2010/011057 A2 | 1/2010 |
| WO | WO 2012/057464 A2 | 5/2012 |

\* cited by examiner

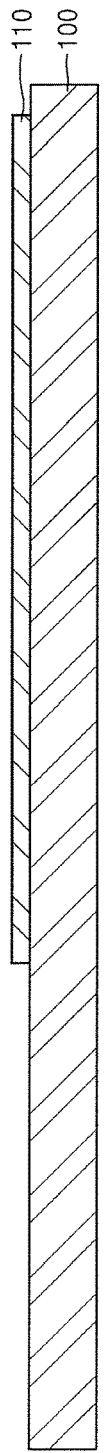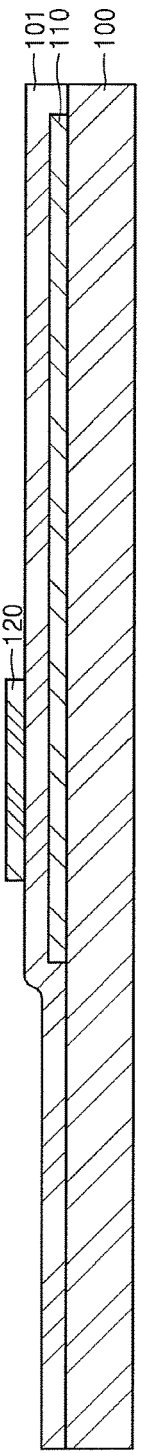
FIG. 6A
FIG. 6B

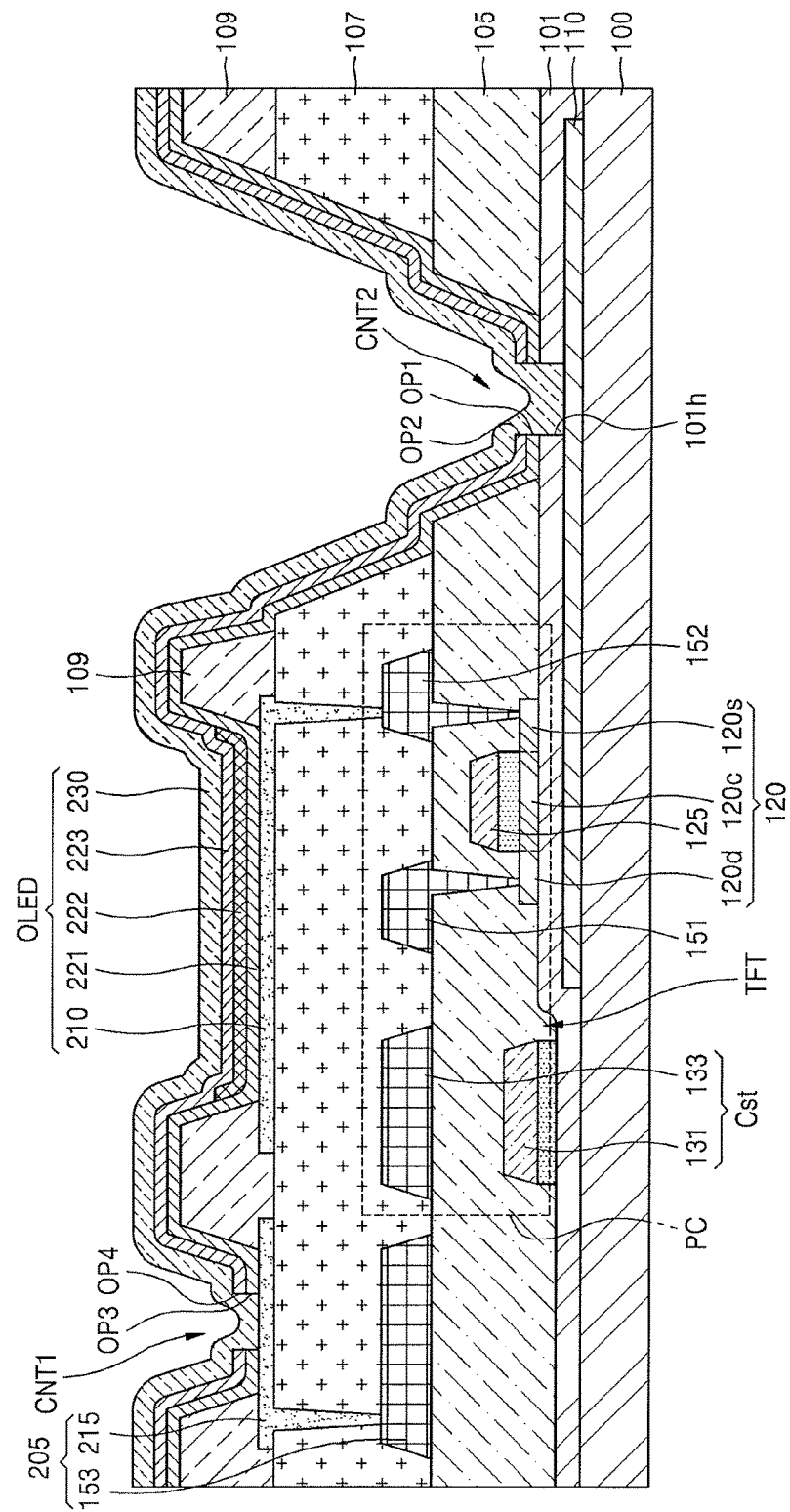

ORGANIC LIGHT-EMITTING DISPLAY DEVICE INCLUDING CONDUCTIVE LAYER AND MANUFACTURING METHOD THEREOF

CROSS-REFERENCE TO RELATED APPLICATION

Korean Patent Application No. 10-2016-0084094, filed on Jul. 4, 2016, in the Korean Intellectual Property Office, and entitled: "Organic Light-Emitting Display Device and Manufacturing Method Thereof," is incorporated by reference herein in its entirety.

BACKGROUND

1. Field

One or more embodiments relate to an organic light-emitting display device and a manufacturing method thereof.

2. Description of the Related Art

Flat panel display devices, e.g., organic light-emitting display devices, liquid crystal display devices, and so forth, are manufactured on a substrate including at least one thin film transistor (TFT), a capacitor, etc., and wirings connecting these to drive the display devices. The TFT includes an active layer providing a channel region, a source region, and a drain region, and a gate electrode electrically insulated from the active layer by a gate insulating layer.

The active layer of the above-configured TFT generally includes a semiconductor material, e.g., amorphous silicon or poly-silicon. When the active layer includes amorphous silicon, mobility is low, making high speed operation difficult. When the active layer includes poly-silicon, mobility is high, but a threshold voltage is non-uniform, requiring a separate compensation circuit. Also, since a conventional TFT manufacturing method using low temperature poly-silicon (LTPS) includes processes, e.g. laser heat treatment, needing a high-priced equipment, equipment investment and management costs are high, and it is difficult to apply the conventional TFT manufacturing method to a large-sized substrate.

SUMMARY

According to one or more embodiments, an organic light-emitting display device includes: a substrate; a thin film transistor over the substrate, the thin film transistor including a semiconductor layer and a gate electrode overlapping the semiconductor layer; a conductive layer between the substrate and the semiconductor layer of the thin film transistor; an insulating layer between the conductive layer and the thin film transistor; a passivation layer covering the thin film transistor; a pixel electrode over the passivation layer, the pixel electrode being electrically connected to the thin film transistor via a contact hole defined in the passivation layer; an emission layer over the pixel electrode; and an opposite electrode over the emission layer, the opposite electrode being electrically connected to the conductive layer.

At least a portion of the conductive layer may overlap a channel region of the semiconductor layer.

The thin film transistor may be a driving thin film transistor.

The insulating layer may include a hole exposing at least a portion of the conductive layer, and the opposite electrode may contact the conductive layer via the hole.

The organic light-emitting display device may further include: a first intermediate layer between the pixel electrode and the emission layer, at least a portion of the first intermediate layer extending to contact the conductive layer and including a first opening corresponding to the hole to allow the opposite electrode to contact the conductive layer via the first opening and the hole.

A portion of the first intermediate layer that is adjacent to the first opening may be a thermally denatured portion.

A center of the hole may coincide with a center of the first opening.

The organic light-emitting display device may further include: a second intermediate layer below the opposite electrode, the second intermediate layer covering the first intermediate layer and the emission layer, and including a second opening corresponding to the hole to allow the opposite electrode to contact the conductive layer via the second opening, the first opening, and the hole.

A center of the hole may coincide with a center of the second opening.

A portion of the second intermediate layer that is adjacent to the second opening may be a thermally denatured portion.

The conductive layer may include at least one of a metallic material and a semiconductor material.

The organic light-emitting display device may further include: an auxiliary electrode adjacent to the pixel electrode, the auxiliary electrode being electrically connected to the opposite electrode.

An electric connection region between the opposite electrode and the auxiliary electrode may not overlap an electric connection region between the opposite electrode and the conductive layer.

The organic light-emitting display device may further include: a plurality of pixels, the conductive layer including portions respectively corresponding to the plurality of pixels and connected to each other.

According to one or more embodiments, a method of manufacturing an organic light-emitting display device, the method includes: forming a conductive layer; forming an insulating layer covering the conductive layer; forming a thin film transistor over the conductive layer, the thin film transistor including a semiconductor layer and a gate electrode overlapping the semiconductor layer; forming a passivation layer covering the thin film transistor; forming a pixel electrode over the passivation layer, the pixel electrode being electrically connected to the thin film transistor via a contact hole defined in the passivation layer; forming a pixel-defining layer covering an edge of the pixel electrode; forming an emission layer over the pixel electrode; forming a hole exposing a portion of the conductive layer; and forming an opposite electrode, the opposite electrode being electrically connected to the conductive layer via the hole and facing the pixel electrode with the emission layer disposed therebetween.

Forming the thin film transistor may include: forming the semiconductor layer such that a channel region of the semiconductor layer overlapping at least the gate electrode overlaps the conductive layer.

Forming of the hole may include: irradiating a laser beam to the insulating layer.

The method may further include: before the forming of the hole, forming a first intermediate layer over the pixel electrode, the pixel-defining layer, and at least a portion of the conductive layer, forming the hole may include removing a portion of the first intermediate layer that corresponds to the conductive layer and a portion of the insulating layer that corresponds to the conductive layer such that at least a portion of the conductive layer is exposed.

The method may further include: between forming the first intermediate layer and forming the hole, forming a second intermediate layer over the pixel electrode, the pixel-defining layer, and at least a portion of the conductive layer, forming the hole including removing a portion of the second intermediate layer that corresponds to the conductive layer, a portion of the first intermediate layer that corresponds to the conductive layer, and a portion of the insulating layer that corresponds to the conductive layer such that at least a portion of the conductive layer is exposed.

Forming the passivation layer may include: forming an opening region corresponding to the hole.

BRIEF DESCRIPTION OF THE DRAWINGS

Features will become apparent to those of skill in the art by describing in detail exemplary embodiments with reference to the attached drawings in which:

FIGS. 6A to 6K illustrate cross-sectional views of stages in a method of manufacturing an organic light-emitting display device according to an embodiment;

DETAILED DESCRIPTION

Figure 1:
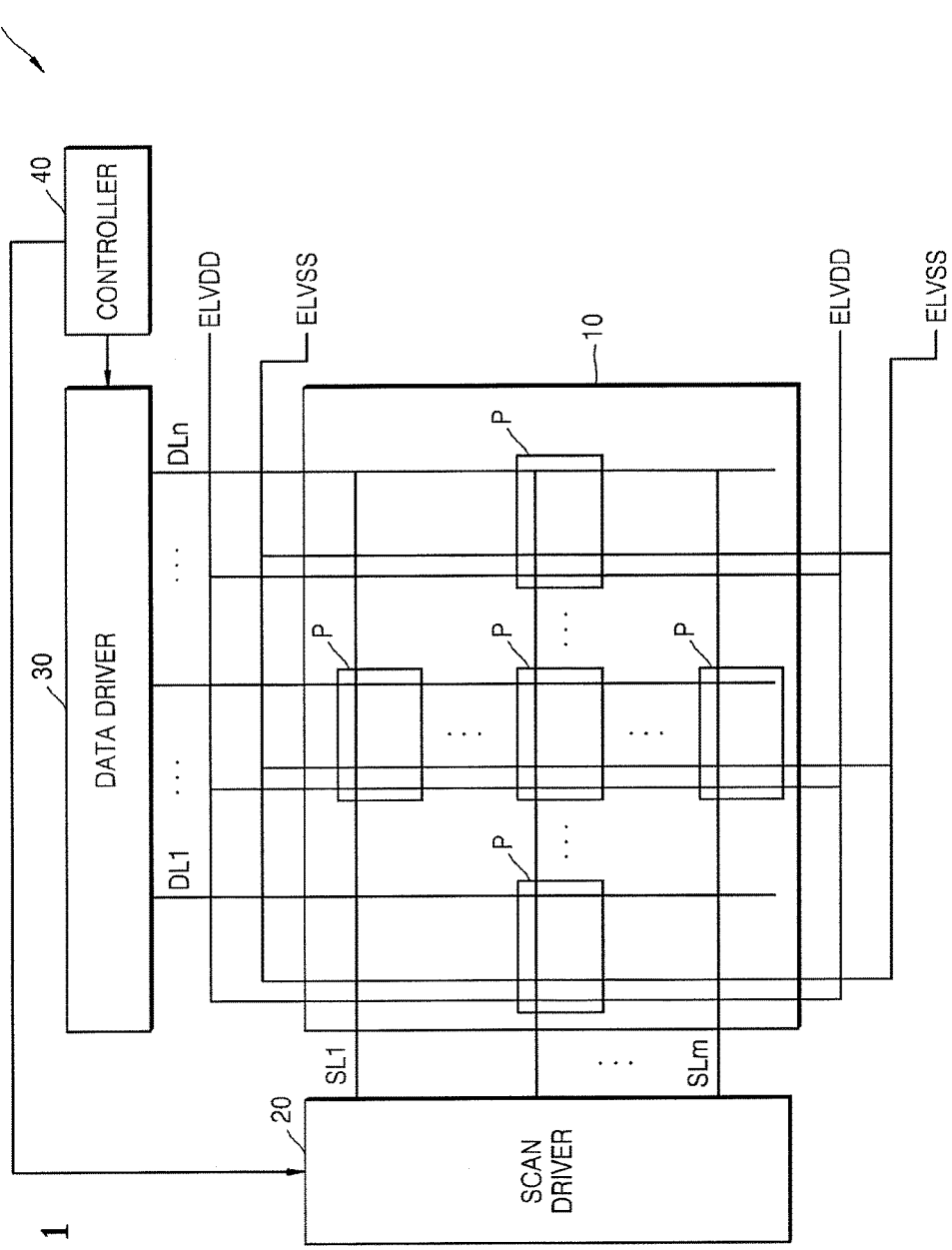
FIG. 1 illustrates a block diagram of an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. It will be understood that although the terms "first", "second", etc. may be used herein to describe various components, these components should not be limited by these terms. These components are only used to distinguish one component from another. As used herein, the singular forms "a" "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2:
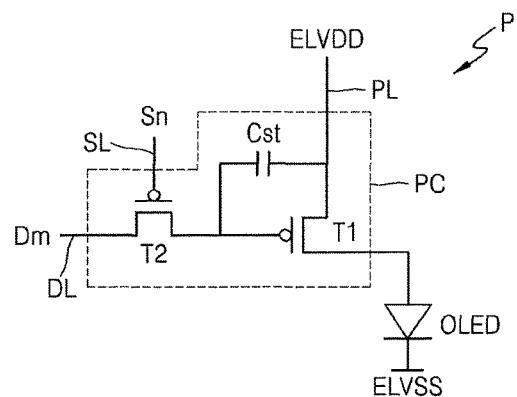
FIG. 2 illustrates an equivalent circuit diagram of one of pixels according to an embodiment.

FIG. 1 is a block diagram of an organic light-emitting display device 1 according to an embodiment. FIG. 2 is an equivalent circuit diagram of one pixel according to an embodiment.

Referring to FIG. 1, the organic light-emitting display device 1 according to an embodiment includes a display portion 10, a scan driver 20, a data driver 30, and a controller 40. The display portion 10 includes a plurality of pixels P. The plurality of pixels P are electrically connected to scan lines SL1 to SLm applying a scan signal and data lines DL1 to DLn applying a data signal.

The scan driver 20 generates scan signals and transfers the same to respective pixels P via the plurality of scan lines SL1 to SLm. The data driver 30 generates data signals and transfers the same to the respective pixels P via the plurality of data lines DL1 to DLn. The pixels P may or may not emit light depending on a logic level of data signals received via the data lines DL1 to DLn in response to scan signals received via the scan lines SL1 to SLm.

The controller 40 may receive image data from outside and control the scan driver 20 and the data driver 30. The controller 40 may generate a plurality of control signals and digital data, provide control signals to the scan driver 20, and provide control signals and digital data to the data driver 30.

Referring to FIG. 2, a pixel P is connected to a scan line SL, a data line DL, and wirings applying a first power voltage ELVDD and a second power voltage ELVSS. The pixel P may include a pixel circuit including a driving thin film transistor (TFT) T1, a switching TFT T2, and a storage capacitor Cst, and an organic light-emitting diode (OLED).

The switching TFT T2 is connected to the scan line SL and the data line DL, and transfers data signal Dm input via the data line DL to the driving TFT T1 in response to a scan signal Sn input via the scan line SL. The storage capacitor Cst is connected to the switching TFT T2 and a driving voltage line PL, and stores a voltage corresponding to a difference between a voltage applied by the switching TFT T2 and the first power voltage ELVDD supplied to the driving voltage line PL. The driving TFT T1 is connected to the driving voltage line PL and the storage capacitor Cst, and may control a driving current flowing through the OLED from the driving voltage line PL in response to the voltage stored in the storage capacitor Cst. The second power voltage ELVSS is applied to a cathode of the OLED, and the OLED may emit light having predetermined brightness by using the driving current.

Though FIG. 2 has described a case where the pixel P includes two TFTs and one storage capacitor, embodiments are not limited thereto. The number of TFTs, the number of storage capacitors, and circuit configuration are changeable.

Figure 3A:
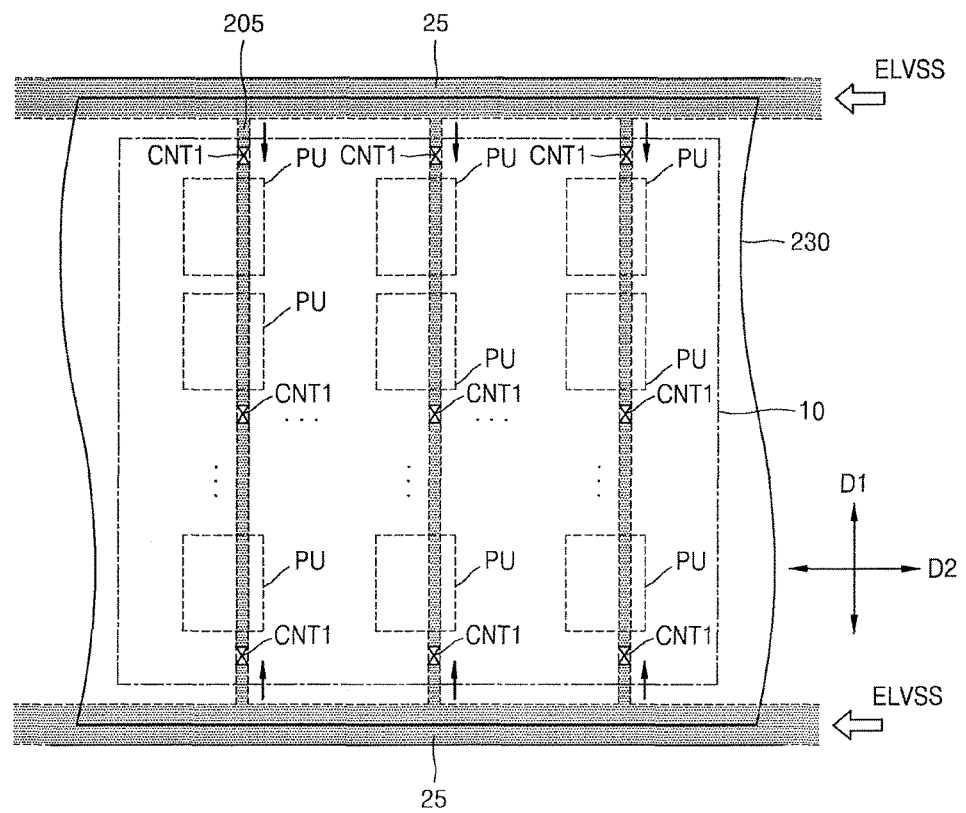
FIG. 3A illustrates a plan view of a wiring providing a second power voltage and an opposite electrode of an organic light-emitting display device according to an embodiment.
Figure 3B:
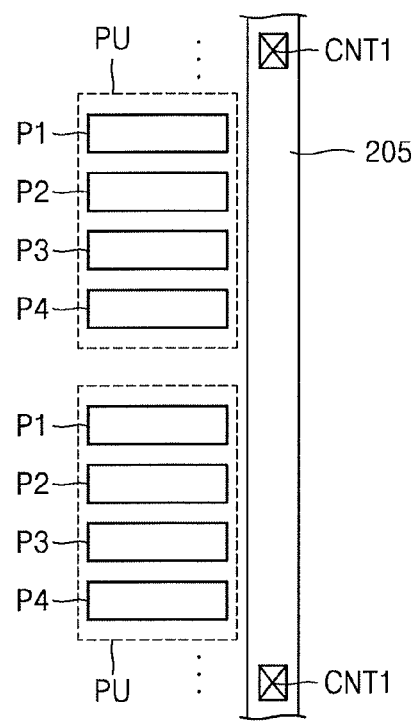
FIG. 3B illustrates a plan view of a portion of FIG. 3A.

FIG. 3A is a plan view of a wiring providing the second power voltage ELVSS and an opposite electrode 230 of an organic light-emitting display device according to an embodiment. FIG. 3B is a plan view of a portion of FIG. 3A.

Referring to FIGS. 3A and 3B, the opposite electrode 230 may be integrally formed, i.e., is a single element, and may entirely cover a display portion 10 including the unit pixels PU. The opposite electrode 230 may be electrically connected to primary wirings 25 respectively arranged at the upper end and the lower end of the display portion 10, and receives the second power voltage ELVSS.

Since the opposite electrode 230 entirely covers the unit pixels PU, the opposite electrode 230 has a relatively large resistance compared with other wirings or electrodes. When the opposite electrode 230 has an excessively large resistance, an IR drop and a brightness deviation may occur. This problem becomes even more serious when the display device is used for a large-sized display panel.

A resistance increase of the opposite electrode 230, an IR drop (voltage drop), and a brightness deviation may be reduced via auxiliary electrodes 205. In an embodiment, a wiring providing the second power voltage ELVSS may include the primary wirings 25 respectively arranged at the upper end and the lower, i.e., at opposite sides of the display portion 10 along a second direction D2, and extending along a first direction D1, and auxiliary electrodes 205 crossing the second direction D2 and extending in the first direction D1. The auxiliary electrodes 205 may be adjacent to unit pixels PU arranged in the first direction D1 and may contact the opposite electrode 230 between the unit pixels PU. Hereinafter, a connection between the auxiliary electrode 205 and the opposite electrode 230 is referred to as a first contact CNT1. Since the auxiliary electrodes 205 are connected to the opposite electrode 230 over the display portion 10, the resistance increase of the opposite electrode 230, the corresponding IR drop, and the brightness deviation may be prevented.

The unit pixel PU may include a plurality of pixels P1, P2, P3, and P4, as illustrated in FIG. 3B. For example, while the unit pixel PU may include a red pixel P1, a green pixel P2, a blue pixel P3, and a white pixel P4, embodiments are not limited thereto. For example, the unit pixel PU may include a red pixel P1, a green pixel P2, and a blue pixel P3.

Figure 4:
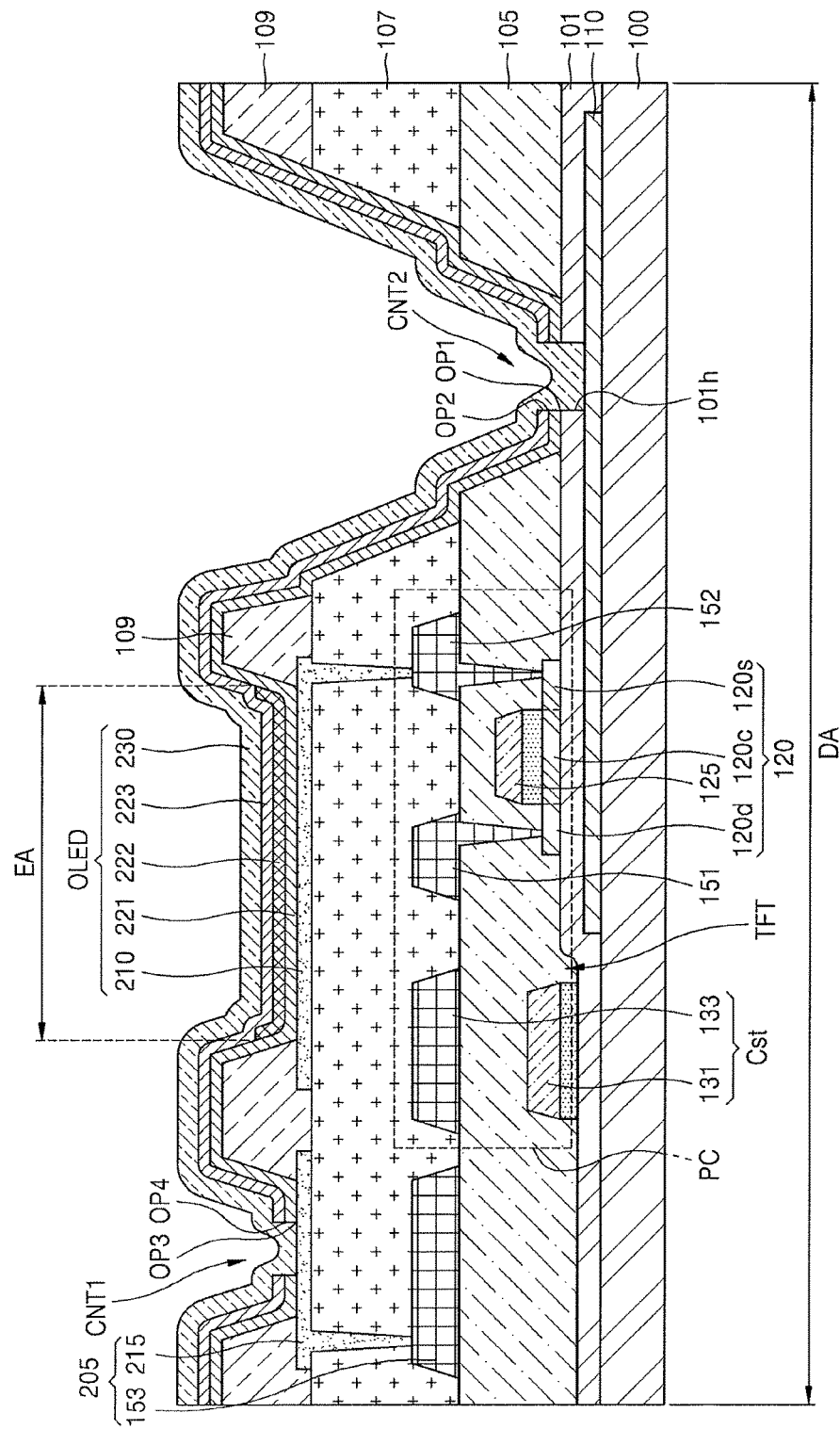
FIG. 4 illustrates a cross-sectional view of one of pixels and a neighborhood thereof provided to a display portion of an organic light-emitting display device according to an embodiment.

FIG. 4 is a cross-sectional view of one of pixels and a neighborhood thereof provided to a display portion of an organic light-emitting display device according to an embodiment. Referring to FIG. 4, a pixel in a display area DA of a substrate 100 may include a pixel circuit PC including a TFT and a storage capacitor Cst having first and second plates 131 and 132, and an OLED electrically connected to the TFT with a passivation layer 107 covering the pixel circuit PC disposed therebetween. The TFT of FIG. 4 may correspond to the driving TFT T1 described above with reference to FIG. 2.

The TFT may include a semiconductor layer 120 and a gate electrode 125. The gate electrode 125 may overlap a channel region 120c of the semiconductor layer 120 with a gate insulating layer 103 between the channel region 120c and the gate electrode 125. Partial regions of the semiconductor layer 120, e.g., a source region 120s and a drain region 120d at both sides of the channel region 120c, respectively correspond to a source electrode and a drain electrode of the TFT. The source region 120s may be connected to a signal input wiring 151 for applying a predetermined signal to the TFT. The drain region 120d may be electrically connected to the OLED via a signal output wiring 152. An interlayer insulating layer 105 may be between the semiconductor layer 120 and the signal input and output wirings 151 and 152.

The semiconductor layer 120 may include poly-silicon or amorphous silicon. Alternatively, the semiconductor layer 120 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 120 may include an oxide semiconductor such as indium gallium zinc oxide (IGZO), zinc tin oxide (ZTO), and zinc indium oxide (ZIO).

When the semiconductor layer 120 includes a silicon-based material, the source region 120s and the drain region 120d may be doped with impurities and, thus, the conductivities of the source region 120s and the drain region 120d may be improved. Alternatively, when the semiconductor layer 120 includes an oxide semiconductor, the source region 120s and the drain region 120d may become conductors by using plasma, etc., and, thus, the conductivities of the source region 120s and the drain region 120d may be improved.

The gate insulating layer 103 may be a single layer or multiple layers including silicon oxide (SiOx) or silicon nitride (SiNx), and the gate electrode 125 may be a single layer or multiple layers including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The conductive layer 110 may be between the substrate 100 and the semiconductor layer 120 and may overlap at least the channel region 120c in the lower portion. For example, the conductive layer 110 overlaps at least the channel region of the driving TFT T1 (see FIG. 2) and has a corresponding size. As shown in FIG. 4, the conductive layer 110 may completely overlap the thin film transistor in a third direction D3, orthogonal to the first and second direction, and may extend along the second direction D2 beyond the signal input wiring 151.

If the conductive layer 110 is a floated conductive layer, the conductive layer 110 may provide an electrostatic introduction path and thus a threshold voltage of the TFT may be changed. However, in some embodiments, one portion of the conductive layer 110 extends outside an emission area EA and is electrically connected to the opposite electrode 230 such that the conductive layer 110 is not in a floated state. For example, the conductive layer 110 may contact, e.g., directly contact, the opposite electrode 230 via a hole 101h formed in an insulating layer 101 covering the conductive layer 110. The conductive layer 110 may extend along the second direction away from the semiconductor layer 120 beyond the hole 101h. Hereinafter, a connection between the conductive layer 110 and the opposite electrode 230 is referred to as a second contact CNT2.

The conductive layer 110 may be connected to a signal line, e.g., the signal input wiring 151 or the signal output wiring 152, such that the conductive layer 110 is not in a floated state, but the voltages of the signal input and output wirings 151 and 152 are not maintained at a constant voltage, e.g., the voltages of the signal input and output wirings 151 and 152 are not fixed voltages applied depending on an on/off operation of the switching TFT T2 (see FIG. 2).

However, according to an embodiment, since the second power voltage ELVSS applied to the opposite electrode 230 has fixedly steady voltage level (e.g. 0 V, -3.5 V, etc.) and the conductive layer 110 is connected to the opposite electrode 230, the conductive layer 110 may maintain a constant voltage level without change. Therefore, a characteristic change of the TFT by static electricity may be minimized, and the occurrence of a parasitic capacitance that may be generated between the conductive layer 110 and other wirings/electrodes may be suppressed.

The conductive layer 110 may not overlap the storage capacitor Cst. Since the conductive layer 110 is connected to the opposite electrode 230 and has a fixedly steady voltage level as described above, the conductive layer 110 may not overlap the storage capacitor Cst in order to suppress the occurrence of a parasitic capacitance between the first plate 131 of the storage capacitor Cst and the conductive layer 110.

The insulating layer 101 may serve as a buffer layer blocking impurities introduced from the outside of the substrate 100 while insulating the conductive layer 110 from the semiconductor layer 120. The insulating layer 101 may be a single layer or multiple layers including SiOx or SiNx. The insulating layer 101 may overlap the conductive layer 110, e.g., along an upper surface and side surfaces thereof, except where the conductive layer 110 is exposed by a hole 101h in the insulating layer 101.

The conductive layer 110 electrically connected to the opposite electrode 230 gets a carrier of a back channel portion of the semiconductor layer 120. The mobility of a carrier may lower more or less through the configuration of the conductive layer 110, but the output characteristic of the TFT, e.g., a current level after a threshold voltage may be maintained constant and, thus, the brightness of light emitted from the OLED may be maintained constant.

The conductive layer 110 may include at least one of a metallic material and a semiconductor material. The metallic material may include, for example, at least one of Al, Pt, Pd, Ag, Mg, Au, Ni, Nd, Ir, Cr, Li, Ca, Mo, Ti, W, and Cu. The semiconductor material may be poly-silicon, amorphous silicon, or an oxide semiconductor. To improve conductivity, poly-silicon or amorphous silicon may be doped with impurities, and an oxide semiconductor may become a conductor.

The OLED includes a pixel electrode 210, an emission layer 222, and an opposite electrode 230. The pixel electrode 210 is over the passivation layer 107, is electrically connected to the TFT, and may be exposed to outside relative to the emission EA with an edge of the pixel electrode 210 covered with a pixel-defining layer 109. The emission layer 222 corresponds to the pixel electrode 210 exposed via the pixel-defining layer 109. The opposite electrode 230 covers the emission layer 222, the pixel-defining layer 109, and the conductive layer 110, and may contact the conductive layer 110 through the hole 101h.

The emission layer 222 may include an organic light-emitting material emitting red, green, blue, or white light. The organic light-emitting material may include a low molecular organic material or a polymer organic material. The OLED may further include functional layers above and/or below the emission layer 222. For example, a first intermediate layer 221 may be between the pixel electrode 210 and the emission layer 222, and a second intermediate layer 223 may be between the emission layer 222 and the opposite electrode 230. The first intermediate layer 221 may include a hole injection layer (HIL) and/or a hole transport layer (HTL), and the second intermediate layer 223 may include an electron transport layer (ETL) and/or an electron injection layer (EIL). The first and second intermediate layers 221 and 223 may not only correspond to the pixel electrode 210, but may also extend in a lateral direction and correspond to the auxiliary electrode 205, the pixel-defining layer 109, and the conductive layer 110, e.g., overlap them along a third direction, orthogonal to the first and second directions, other than at openings O1 to O4 therein. For example, the first and second intermediate layers 221 and 223, may have first and second openings O1 and O2 that correspond to the hole 101h, respectively.

The auxiliary electrode 205 adjacent to the pixel electrode 210 and electrically connected to the opposite electrode 230 may reduce or prevent a resistance and a corresponding IR drop, etc., as described above. The auxiliary electrode 205 may be electrically connected to the opposite electrode 230 via third and fourth openings OP3 and OP4 formed in the first and second intermediate layers 221 and 223, respectively.

The auxiliary electrode 205 may include a first auxiliary electrode 215 including the same material as that of the pixel electrode 210, and a second auxiliary electrode 153 electrically connected to the first auxiliary electrode 215, but embodiments are not limited thereto. As another embodiment, like the first auxiliary electrode 215, the auxiliary electrode 205 may be a layer including the same material as that of the pixel electrode 210. Alternatively, like the second auxiliary electrode 153, the auxiliary electrode 205 may be a layer including the same material as that of the signal input and output wirings 151 and 152.

Figure 5A:
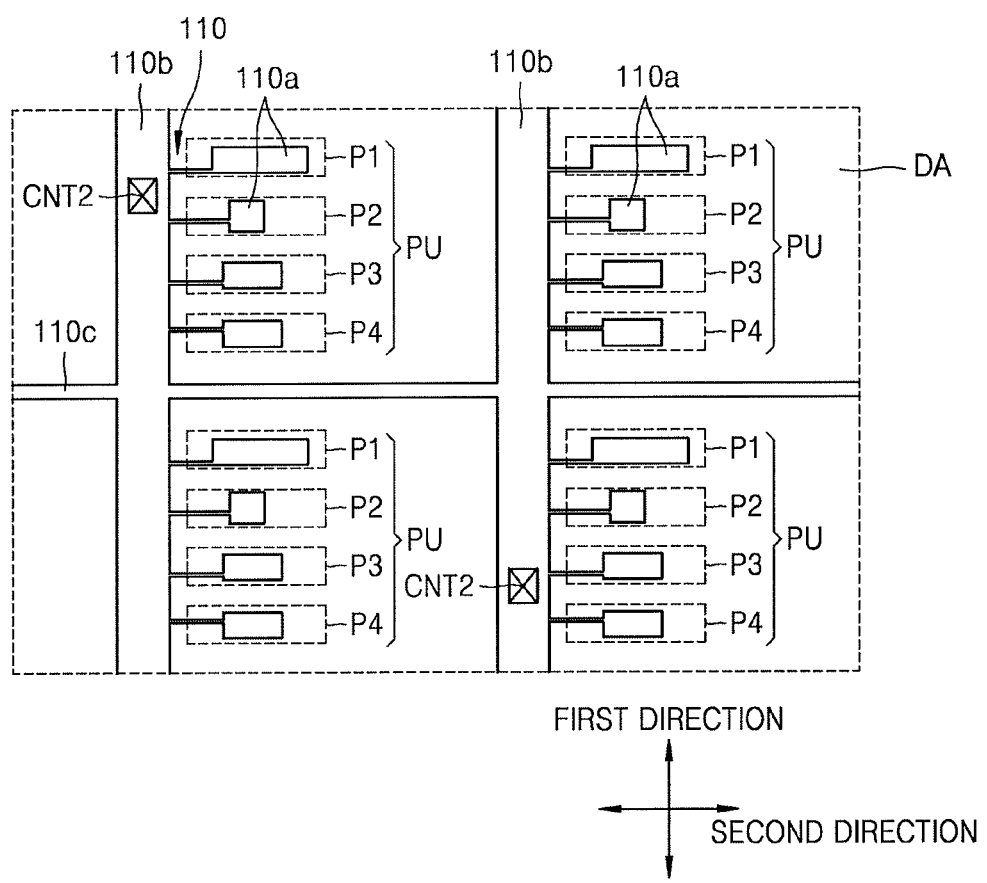
FIGS. 5A and 5B illustrate plan views of a portion of a display portion of an organic light-emitting display device according to an embodiment.
Figure 5B:
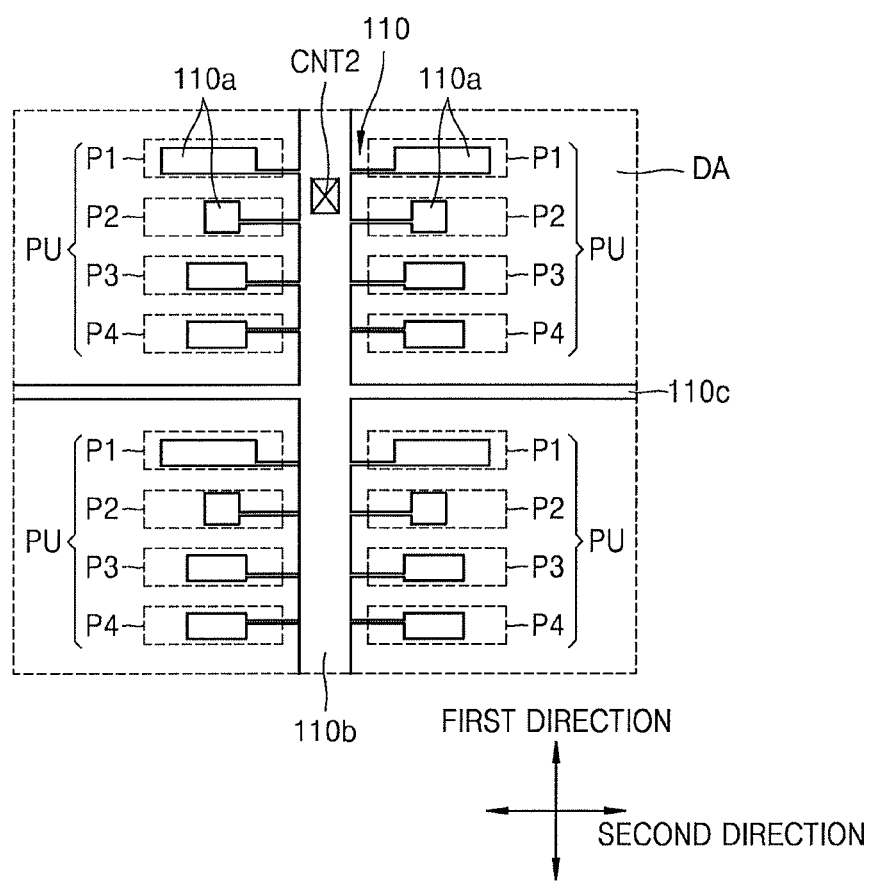

FIGS. 5A and 5B are plan views of a portion of a display portion of an organic light-emitting display device according to an embodiment. For convenience of description, FIGS. 5A and 5B illustrate only the conductive layer 110.

Referring to FIG. 5A, the conductive layer 110 is provided to respective pixels P1, P2, P3, and P4 and includes an overlapping portion 110a overlapping at least the channel region 120c of the semiconductor layer 120 of the TFT (see FIG. 4) of the respective pixels P1, P2, P3, and P4. The overlapping portions 110a provided to the respective pixels P1, P2, P3, and P4 may be connected to each other by a first connection portion 110b and a second connection portion 110c. The overlapping portion 110a, the first connection portion 110b, and the second connection portion 110c may include the same material and may be integrally formed in the same layer. The second contact CNT2 between the conductive layer 110 and the opposite electrode 230 may be arranged one by one over a plurality of unit pixels PU.

Though FIG. 5A illustrates a structure in which the first connection portion 110b is arranged, one by one, to every column of the unit pixels PU arranged in the first direction, and adjacent first connection portions 110b are connected to each other by the second connection portion 110c extending in the second direction, embodiments are not limited thereto.

Referring to FIG. 5B, the first connection portion 110b may be arranged, one by one, to two columns of unit pixels PU arranged in the first direction. In other embodiments, even in this case, the second contact CNT2 between the conductive layer 110 and the opposite electrode 230 may be arranged one by one over the plurality of unit pixels PU.

Additionally, as illustrated in FIGS. 5A and 5B, the overlapping portions 110a may have different sizes in accordance with a size of the channel regions of the respective pixels P1, P2, P3, and P4.

FIGS. 6A to 6K are cross-sectional views illustrating stages in a method of manufacturing an organic light-emitting display device according to an embodiment.

Referring to FIG. 6A, the conductive layer 110 is formed above the substrate 100. The conductive layer 110 may be formed by a method of forming a conductive material layer over the substrate 100 and then etching the same by using a mask.

The substrate 100 may include various materials such as a glass material or a plastic material including polyethylene terephthalate (PET), polyethylene naphthalate (PEN), polyimide, etc. In the case where the substrate 100 includes a plastic material, the flexibility of the substrate 100 may improve compared with using a glass material.

The conductive layer 110 may include at least one of a metallic material and a semiconductor material. The metallic material may include, for example, at least one of Al, Pt, Pd, Ag, Mg, Au, Ni, Nd, Ir, Cr, Li, Ca, Mo, Ti, W, and Cu. The semiconductor material may be poly-silicon, amorphous silicon, or an oxide semiconductor. In the case where the conductive layer 110 includes a semiconductor material, a process of doping the semiconductor material with impurities, and/or a process of making the semiconductor material a conductor by using plasma, etc. may be further performed.

Referring to FIG. 6B, the insulating layer 101 is formed over the conductive layer 110. The insulating layer 101 may be a single-layered or multi-layered inorganic layer including SiOx or SiNx. The insulating layer 101 may cover the conductive layer 110.

After that, the semiconductor layer 120 may be formed by forming a semiconductor material layer over the insulating layer 101 and then patterning the same. In this case, a partial region of the semiconductor layer 120, for example, the region of the semiconductor layer 120 that corresponds to the channel region 120c described above with reference to FIG. 4 overlaps the conductive layer 110.

The semiconductor layer 120 may include poly-silicon or amorphous silicon. As another embodiment, the semiconductor layer 120 may include an oxide of at least one of In, Ga, Sn, Zr, V, Hf, Cd, Ge, Cr, Ti, and Zn. For example, the semiconductor layer 120 may include an oxide semiconductor such as IGZO, ZTO, and ZIO.

Figure 6C:
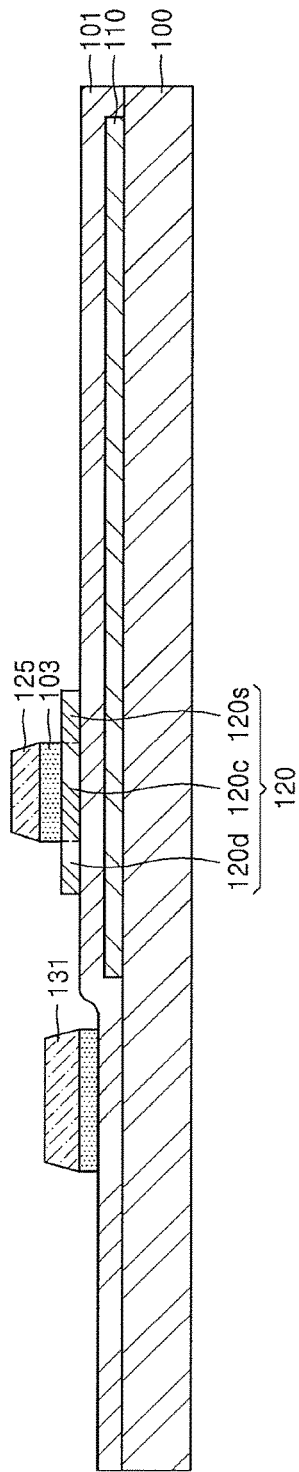

Referring to FIG. 6C, the gate electrode 125 is formed over the semiconductor layer 120. As an embodiment, the gate insulating layer 103 and the gate electrode 125 may be formed by sequentially forming a gate insulating material layer (not shown) and a metallic layer over the substrate 100 including the semiconductor layer 120, and then patterning the same. During the process of forming the gate electrode 125, the first plate 131 of the storage capacitor Cst (see FIG. 4) may be simultaneously formed.

The gate insulating layer 103 may be a single layered or multi-layered inorganic layer including SiOx, SiNx, or SiON. The gate electrode 125 and the first plate 131 may include a single layer or multiple layers including at least one of Al, Pt, Pd, Ag, Mg, Au, Ni, Nd, Ir, Cr, Li, Ca, Mo, Ti, W, and Cu.

After the gate electrode 125 is formed, portions of the semiconductor layer 120 that do not overlap the gate electrode 125 may be doped with impurities by using the gate electrode 125 as a self-align mask, or may be plasma-processed. Thus, the conductivities of the source region 120s and the drain region 120d may be improved.

Figure 6D:
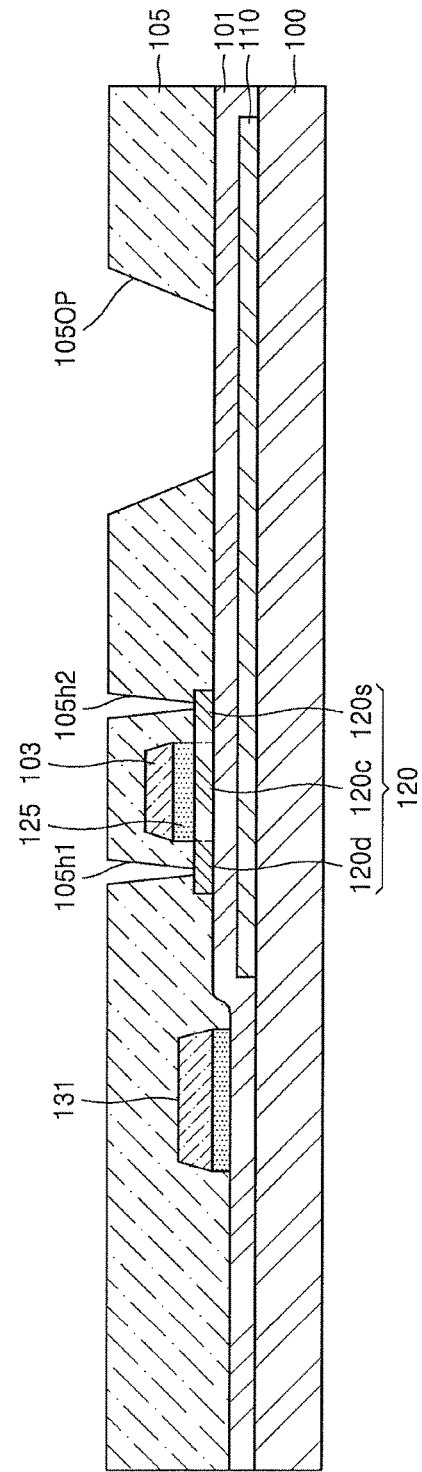

Referring to FIG. 6D, after the interlayer insulating layer 105 is formed over the substrate, holes 105h1 and 105h2 exposing the source region 120s and the drain region 120d are formed by an etching process. A first opening region 105OP corresponding to a portion of the conductive layer 110 may be simultaneously formed. The interlayer insulating layer 105 may be a single layer or multiple layers including an inorganic material such as SiOx, SiNx, and/or $Al_2O_3$.

Figure 6E:
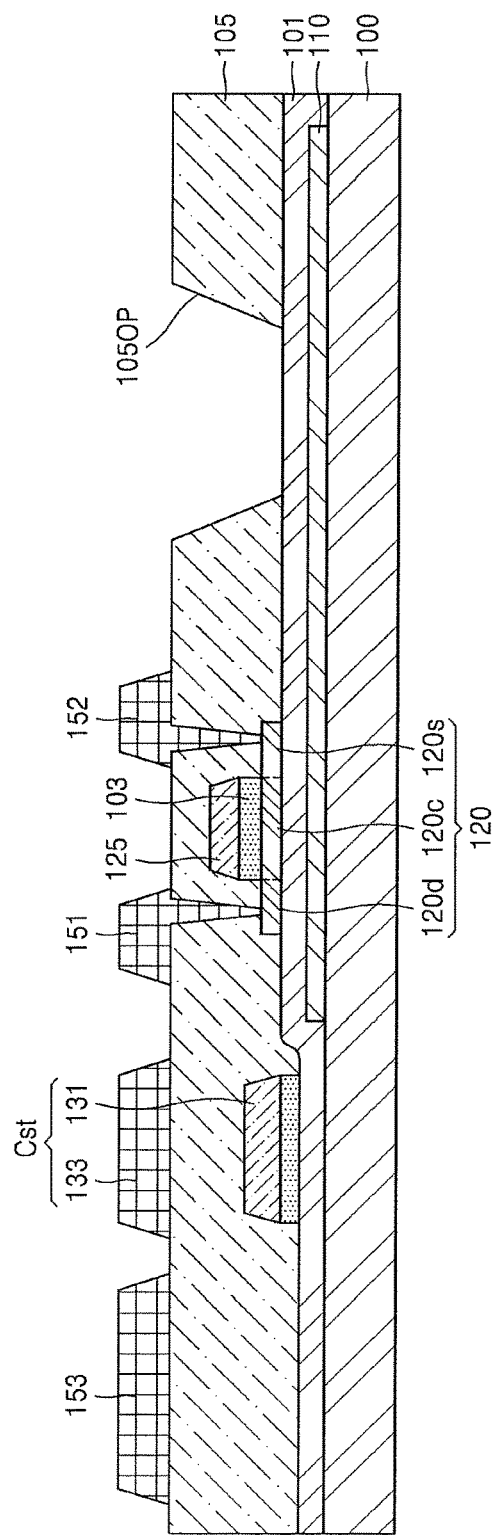

Referring to FIG. 6E, the signal input and output wirings 151 and 152, the second plate 133 of the storage capacitor Cst (see FIG. 4), and the second auxiliary electrode 153 are formed over the interlayer insulating layer 105. The signal input and output wirings 151 and 152 are electrically connected to the source region 120s and the drain region 120d via the holes 105h1 and 105h2, respectively.

The signal input and output wirings 151 and 152, the second plate 133, and the second auxiliary electrode 153 may be a single layer or multiple layers including a metallic layer including Al, Pt, Pd, Ag, Mg, Au, Ni, Nd, Ir, Cr, Li, Ca, Mo, Ti, W, Cu, and an alloy thereof. For example, the signal input and output wirings 151 and 152, the second plate 133, and the second auxiliary electrode 153 may be a single layer including Mo and Ti, or multiple layers including Mo/Al/Mo or Ti/Cu.

Figure 6F:
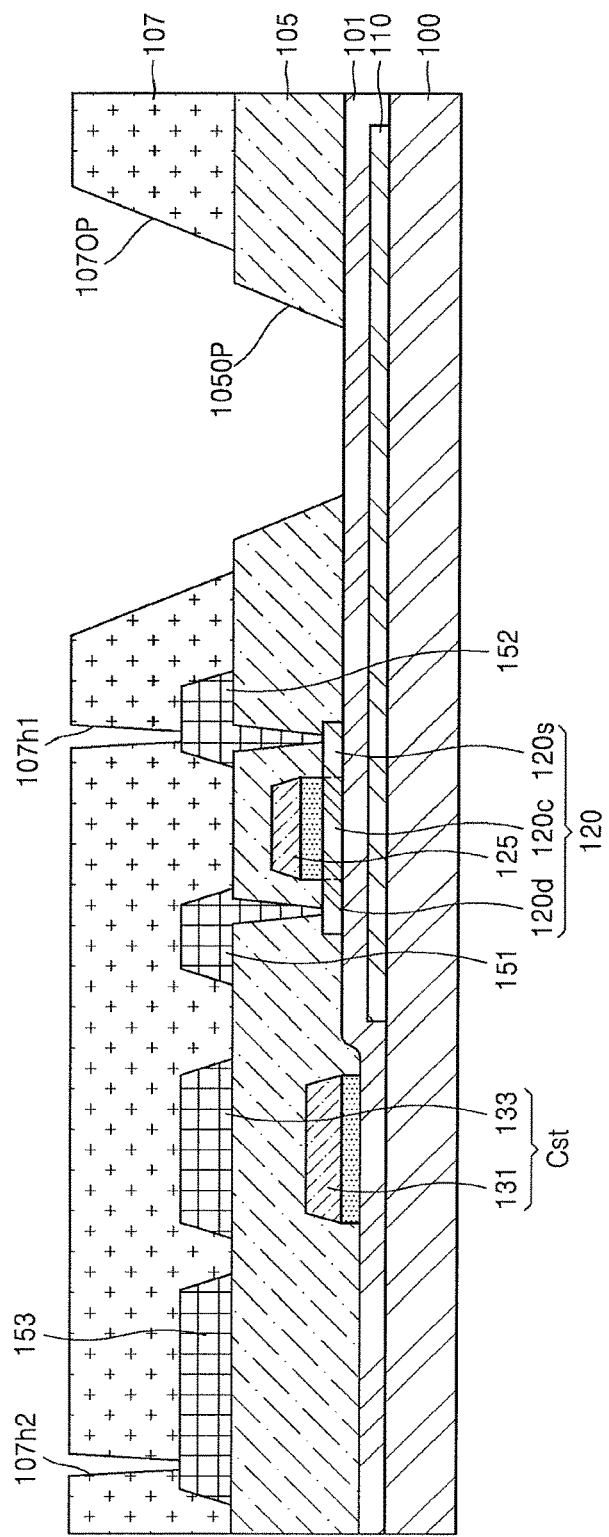

Referring to FIG. 6F, the passivation layer 107 is formed over the substrate 100, and holes 107h1 and 107h2 exposing the signal output wiring 152 and the second auxiliary electrode 153 are formed via an etching process. During the process of forming the holes 107h1 and 107h2, a second opening region 107OP corresponding to the first opening region 105OP of the interlayer insulating layer 105 may be simultaneously formed in the passivation layer 107.

The passivation layer 107 may include an organic material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof, but embodiments are not limited thereto.

Figure 6G:
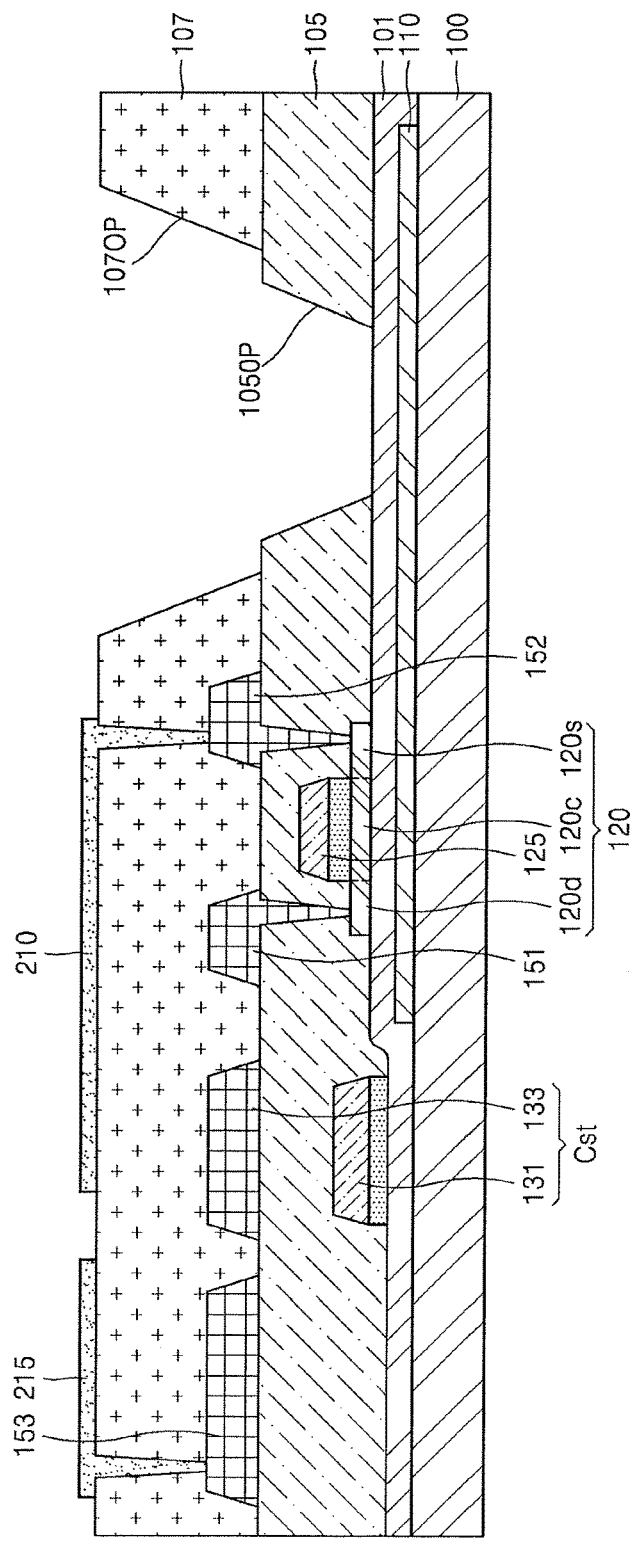

Referring to FIG. 6G, the pixel electrode 210 and the first auxiliary electrode 215 may be formed by forming an electrode material layer over the passivation layer 107, including filling the holes 107h1 and 107h2, and then patterning the same. The pixel electrode 210 may be connected to the signal output wiring 152 via the hole 107h1, and the first auxiliary electrode 215 may be connected to the second auxiliary electrode 153 via the hole 107h2.

The pixel electrode 210 may be a reflective electrode or an optically clear electrode. When the pixel electrode 210 is a reflective electrode, the pixel electrode 210 may include a reflective layer including Ag, Mg, Al, Pt, Pd, Au, Ni, Nd, Ir, Cr, or a compound thereof. Alternatively, the pixel electrode 210 may include the above-described reflective layer and a transparent conductive oxide (TCO) layer above and/or below the reflective layer. The first auxiliary electrode 215 may include the same material as that of the pixel electrode 210.

Figure 6H:
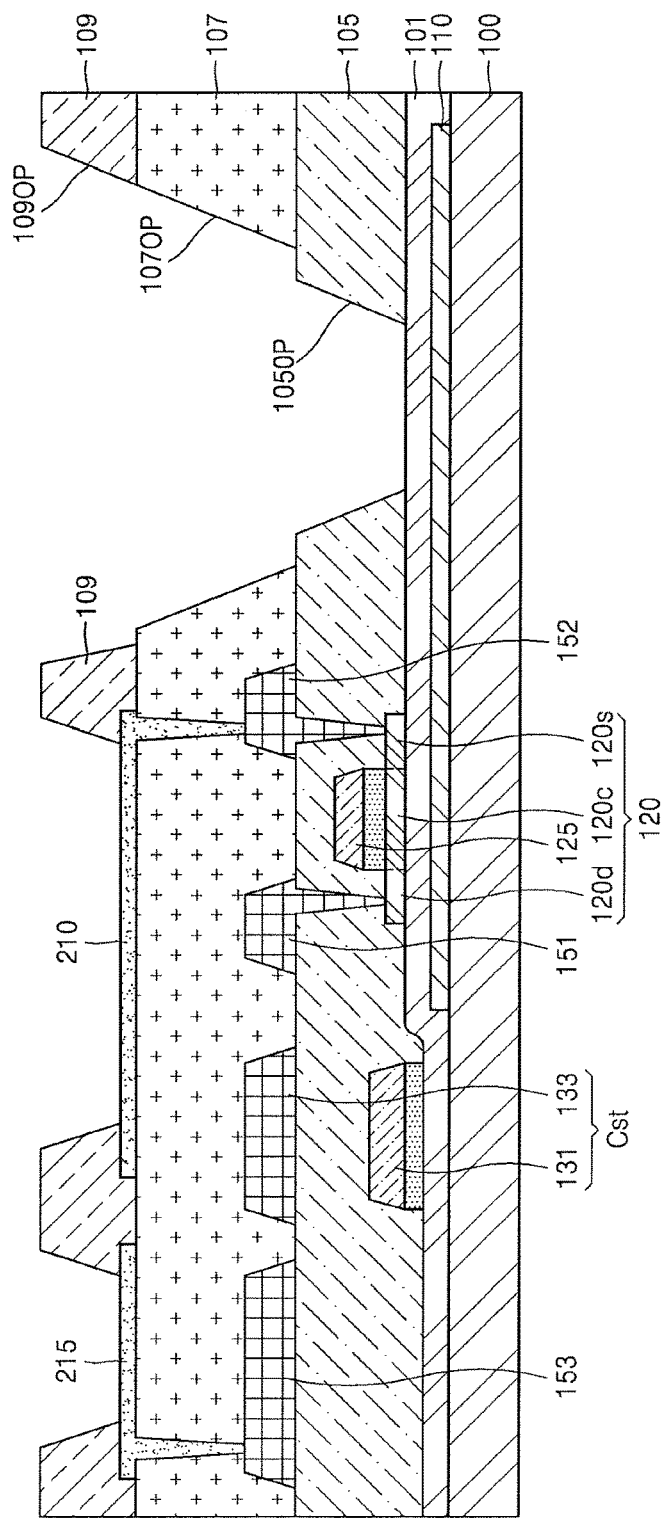

Referring to FIG. 6H, the pixel-defining layer 109 is formed. The pixel-defining layer 109 covers the edges of the pixel electrode 210 and the first auxiliary electrode 215 and exposes the pixel electrode 210 and the first auxiliary electrode 215. The pixel-defining layer 109 may include an organic insulating material and an inorganic insulating material, or include only an organic insulating material, or include only an inorganic insulating material. The pixel-defining layer 109 may include a third opening region 109OP corresponding to the first and second opening regions 105OP and 107OP.

Figure 6I:
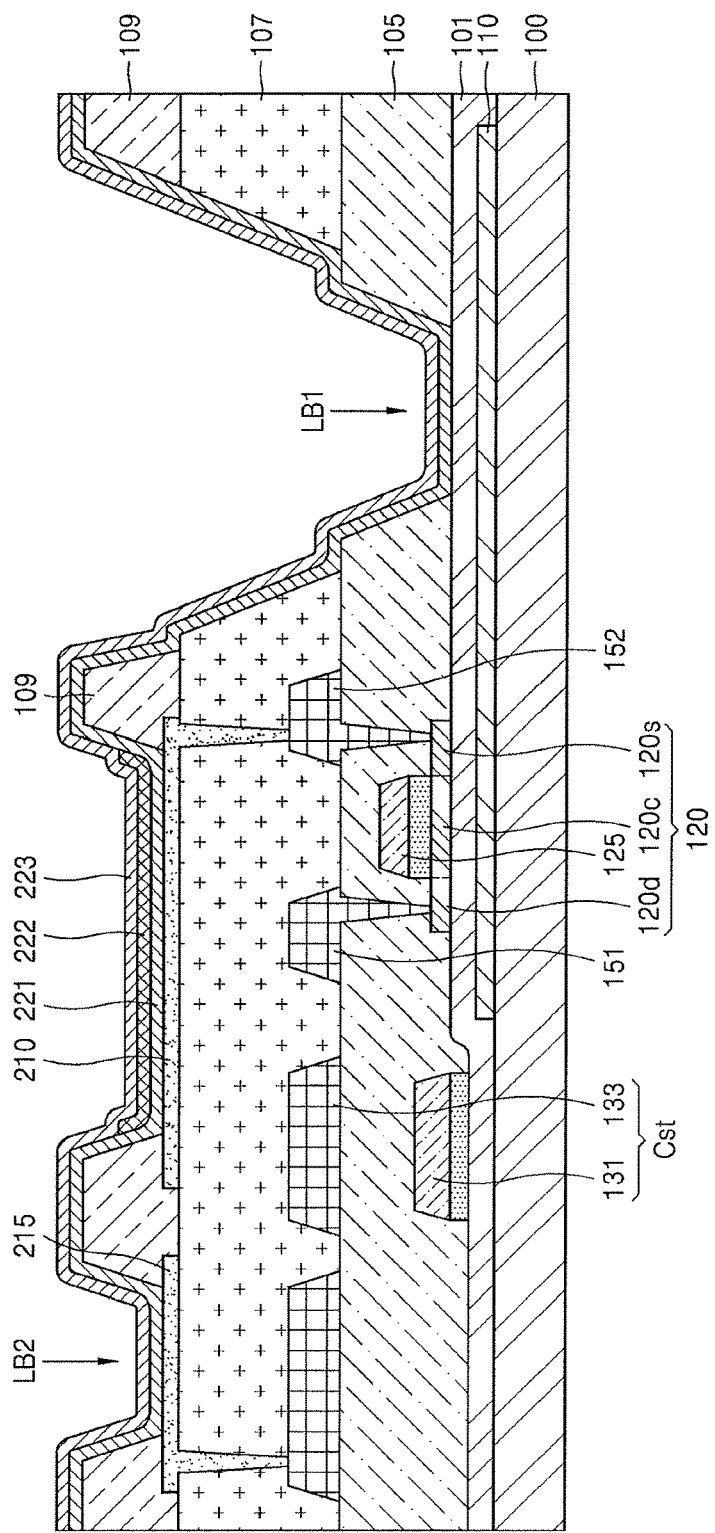

Referring to FIG. 6I, the first intermediate layer 221, the emission layer 222, and the second intermediate layer 223 are sequentially formed. The first intermediate layer 221 may include an HIL and/or an HTL, and the second intermediate layer 223 may include an ETL and/or an EIL. The emission layer 222 may include a low molecular or polymer organic light-emitting material and may be arranged to correspond to the pixel electrode 210. The first and second intermediate layers 221 and 223 may cover not only the pixel electrode 210, but also may cover the upper surface of the first auxiliary electrode 215, the upper surface of the pixel-defining layer 109, and the first and second opening regions 105OP and 107OP.

Figure 6J:
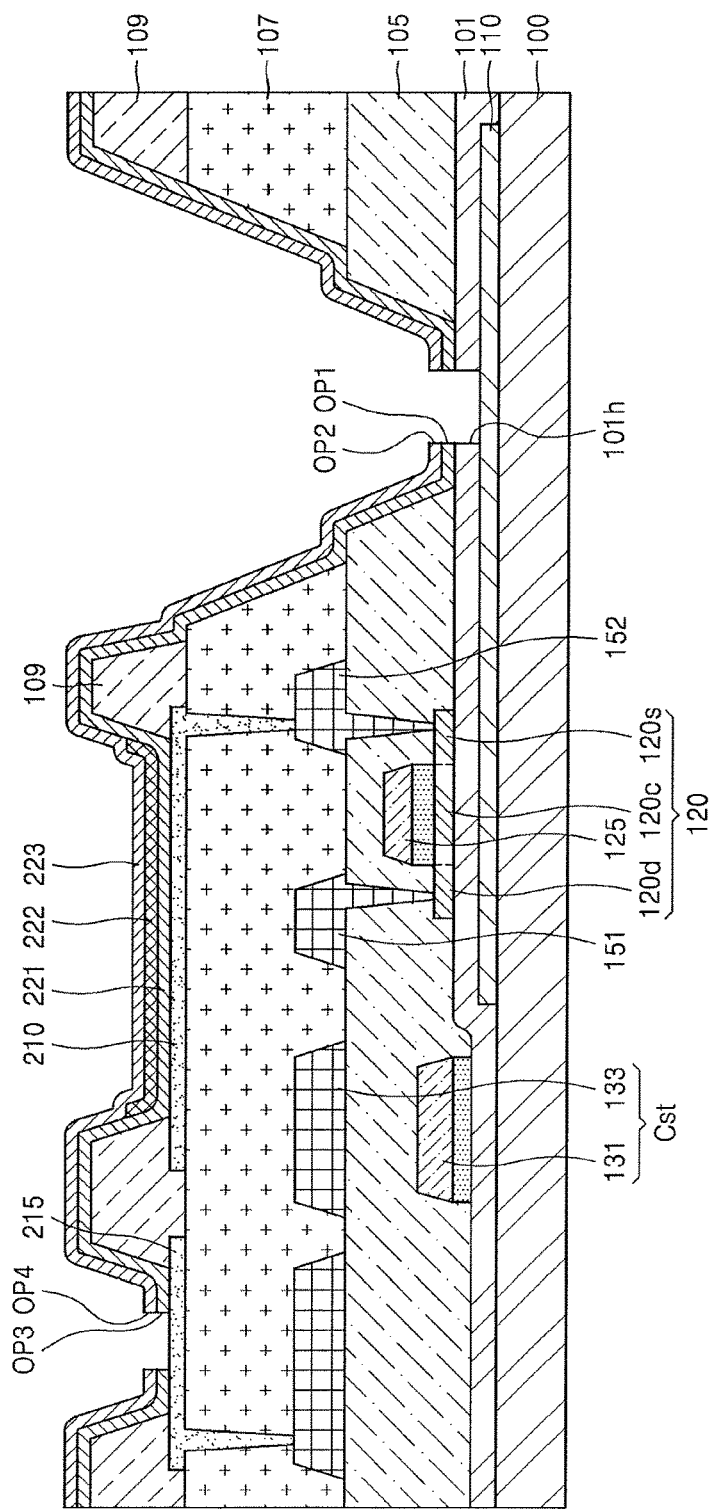

Referring to FIG. 6J, the hole 101h of the insulating layer 101, a first opening OP1 of the first intermediate layer 221, and a second opening OP2 of the second intermediate layer 223 may formed and at least a portion of the conductive layer 110 may be exposed by removing portions of the insulation layer 101, and the first and second intermediate layers 221 and 223 that correspond to the portion of the conductive layer 110. For this purpose, the second opening OP2 of the second intermediate layer 223, the first opening OP1 of the first intermediate layer 221, and the hole 101h of the insulating layer 101 may be simultaneously formed by irradiating a laser beam LB1 (see FIG. 6I, referred to as a first laser beam) onto the second intermediate layer 223.

The second opening OP2, the first opening OP1, and the hole 101h may be formed by using the same laser beam during the same process. Since the materials of the second intermediate layer 223, the first intermediate layer 221, and the insulating layer 101 are different from one another, even when the same laser beam is used, the sizes of the second opening OP2, the first opening OP1, and the hole 101h may be different from one another, but the centers of the second opening OP2, the first opening OP1, and the hole 101h may coincide with one another.

Due to high heat of the first laser beam LB1, portions of the first and second intermediate layers 221 and 223 adjacent to the first and second openings OP1 and OP2 may be denatured by heat. Likewise, a portion of the insulating layer 101 adjacent to the hole 101h may be denatured by heat.

The third opening OP3 of the first intermediate layer 221 and the fourth opening OP4 of the second intermediate layer 223 are formed, and at least a portion of the first auxiliary electrode 215 is exposed by removing portions of the first and second intermediate layers 221 and 223 that correspond to the first auxiliary electrode 215. For example, the fourth opening OP4 of the second intermediate layer 223 and the third opening OP3 of the first intermediate layer 221 may be simultaneously formed by irradiating a laser beam LB2 (see FIG. 6I, referred to as a second laser beam) to the second intermediate layer 223. Unlike the first laser beam LB1, which removes not only the portions of the first and second intermediate layers 221 and 223 but also the portion of the insulating layer 101, the second laser beam LB2 removes the portions of the first and second intermediate layers 221 and 223. Thus, the second laser beam LB2 may have power different from, e.g., lower than, the power of the first laser beam LB1.

The fourth opening OP4 and the third opening OP3 may be formed using the same laser beam during the same process. Since the materials of the second intermediate layer 223 and the first intermediate layer 221 are different from each other, even when the same laser beam is used, the sizes of the fourth opening OP4 and the third opening OP3 may be different from each other, but the centers of the fourth opening OP4 and the third opening OP3 may coincide with each other. Due to high heat of the second laser beam LB2, portions of the first and second intermediate layers 221 and 223 adjacent to the third and fourth openings OP3 and OP4 may be denatured by heat.

Referring to FIG. 6K, the opposite electrode 230 is formed. As described above with reference to FIG. 2, the opposite electrode 230 may be integrally formed over a plurality of pixels and may cover the display portion 10 (see FIG. 2). Therefore, the opposite electrode 230 may cover all of the pixel electrode 210, the first auxiliary electrode 215, and the conductive layer 110.

The opposite electrode 230 may be electrically connected to the conductive layer 110 by contacting the conductive layer 110 via the hole 101h and the first and second openings OP1 and OP2, and electrically connected to the first auxiliary electrode 215 by contacting the first auxiliary electrode 215 via the third and fourth openings OP3 and OP4.

The opposite electrode 230 may be a (semi) transmissive electrode or a reflective electrode. In the case where the opposite electrode 230 is a (semi) transmissive electrode, the opposite electrode 230 may include a thin semi-transmissive metallic layer including at least one of Li, Ca, LiF/Ca, LiF/Al, Al, Mg, Ag, and an alloy of Ag and Mg having a small work function, and/or may include a transmissive layer of ITO, IZO, ZnO, $In_2O_3$, IGO, or AZO, etc. In the case where the opposite electrode 230 includes a thin semi-transmissive metallic layer, a problem of a high resistance originated from the thickness of the thin semi-transmissive metallic layer may be supplemented by forming a transparent conductive layer of ITO, IZO, ZnO, $In_2O_3$, IGO, or AZO, etc., on the thin semi-transmissive metallic layer. When the opposite electrode 230 is the reflective electrode, the opposite electrode 230 may include metallic materials, which have a small work function, and may be thick.

Though a structure in which both the first intermediate layer 221 and the second intermediate layer 223 are provided is described according to an embodiment, embodiments are not limited thereto. As another embodiment, the first and second intermediate layers 221 and 223 may be omitted, or only the second intermediate layer 223 may be omitted.

So that the conductive layer 110 is not in a floated state, e.g., is in contact with the opposite electrode 230, a portion of the insulating layer 101 that corresponds to at least a portion of the conductive layer 110 should be removed as illustrated in FIG. 6K.

For this purpose, a method of forming the hole 101h to expose at least a portion of the conductive layer 110 when initially forming the insulating layer 101 may be used. However, in this case, an additional mask should be used in order to form the hole 101h. Accordingly, the additional mask and the substrate 100 should be aligned accurately, complicating the manufacturing process. As another method of allowing the conductive layer 100 not to be in a floated state, one of the signal input and output wirings 151 and 152, instead of the opposite electrode 230, may contact the conductive layer 110. However, in this case, as described above, a mask process for forming the hole 101h to expose at least a portion of the conductive layer 110 when initially forming the insulating layer 101 should be added.

However, according to the present embodiment, since the conductive layer 110 is connected to the opposite electrode 230 by using a laser beam in order to form the hole 101h exposing the conductive layer 110, an increase in the number of masks may be prevented.

According to the embodiment described with reference to FIGS. 6A to 6H, though the first to third opening regions 105OP, 107OP, and 109OP passing through the interlayer insulating layer 105, the passivation layer 107, and the pixel-defining layer 109 have been formed during the process, embodiments are not limited thereto. As another embodiment, the first to third opening regions 105OP, 107OP, and 109OP may not be formed, and in this case, holes and openings passing through the pixel-defining layer 109, the passivation layer 107, and the interlayer insulating layer 105, the first and second intermediate layers 221 and 223, and the insulating layer 101 may be simultaneously formed by increasing the power of the first laser beam LB1 when irradiating the first laser beam LB1. However, when the opposite electrode 230 is thin, to prevent disconnection of the opposite electrode 230, the first to third opening regions 105OP, 107OP, and 109OP may be formed as described with reference to FIGS. 6A to 6H.

Figure 7:
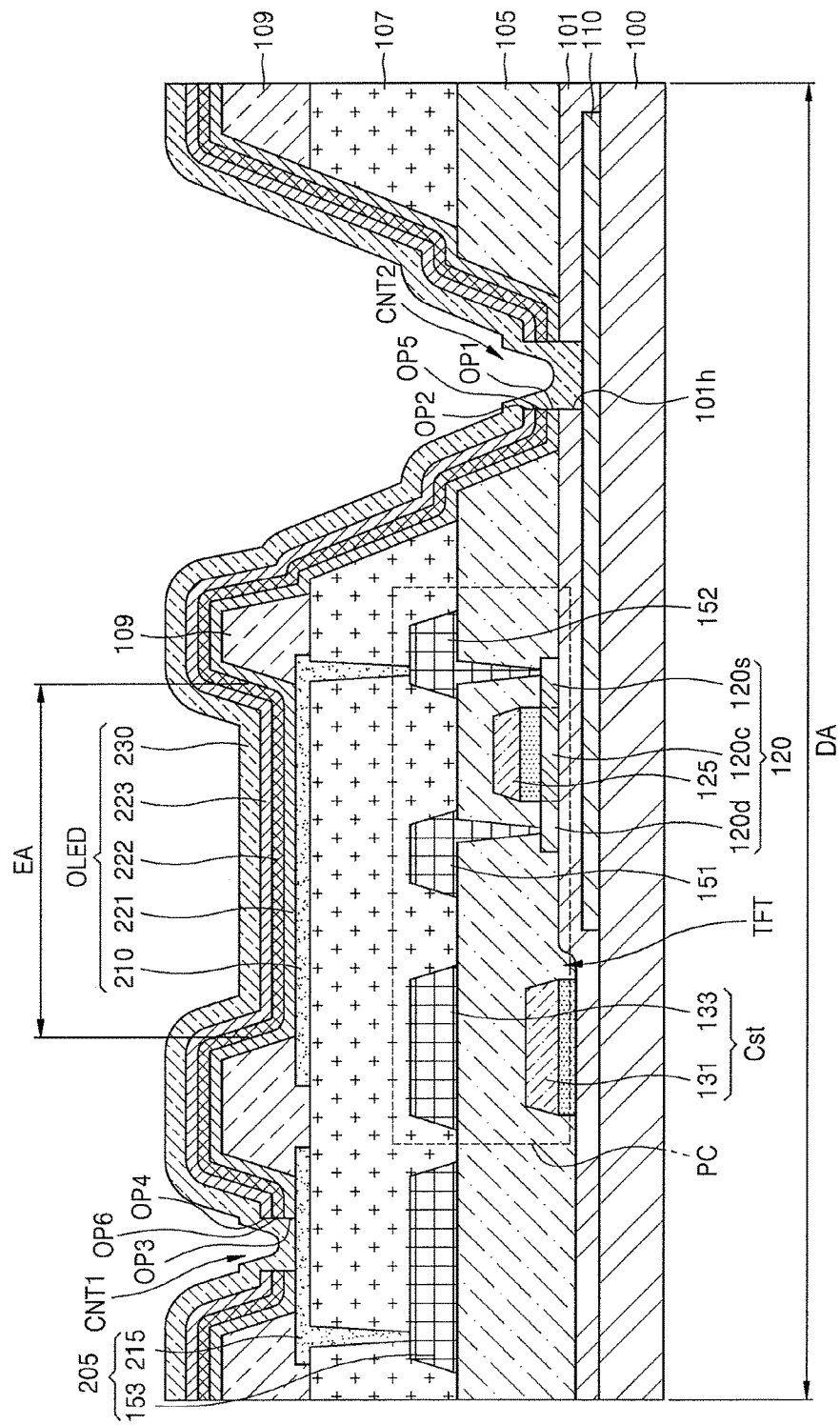
FIG. 7 illustrates a cross-sectional view of an organic light-emitting display device according to another embodiment.

FIG. 7 is a cross-sectional view of an organic light-emitting display device according to another embodiment. Though the emission layer 222 of the organic light-emitting display device described above with reference to FIG. 4 corresponds to the emission area EA, embodiments are not limited thereto. The emission layer 222 may be in the emission area EA, and may be also over the pixel electrode 210 and the pixel-defining layer 109 depending on a method of forming the emission layer 222. In this case, a portion of the emission layer 222 that corresponds to the conductive layer 110 may be removed and may form a fifth opening OP5, and a portion of the emission layer 222 that corresponds to the auxiliary electrode 205 may be removed and may form a sixth opening OP6. A portion of the emission layer adjacent to the fifth opening OP5 may be a portion denatured by high heat of the first laser beam LB1 (see FIG. 6I), and a portion of the emission layer adjacent to the sixth opening OP6 may be a portion denatured by high heat of the second laser beam LB2 (see FIG. 6I).

Figure 8A:
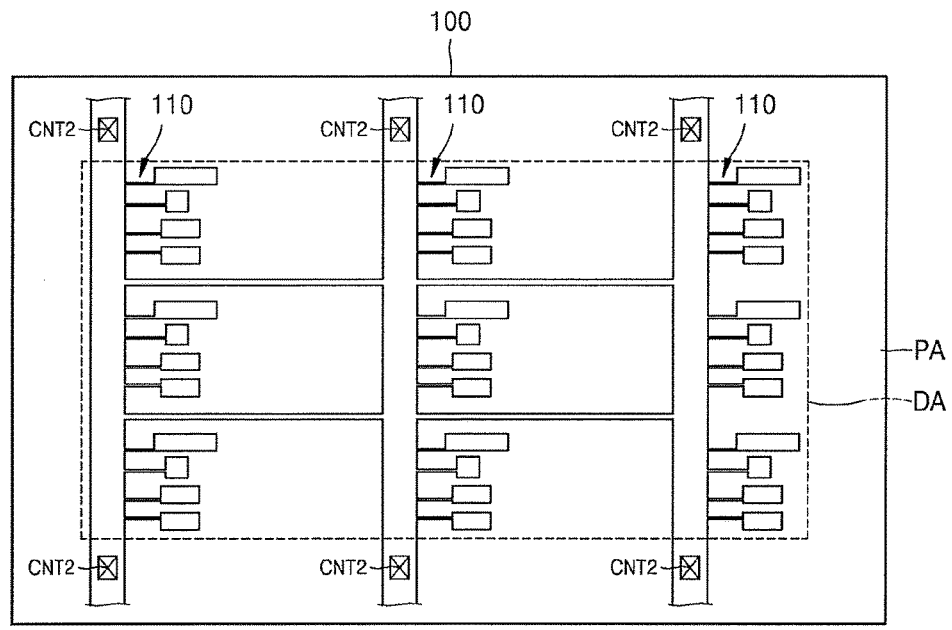
FIGS. 8A and 8B illustrate plan views of a conductive layer over a substrate of an organic light-emitting display device according to another embodiment.
Figure 8B:
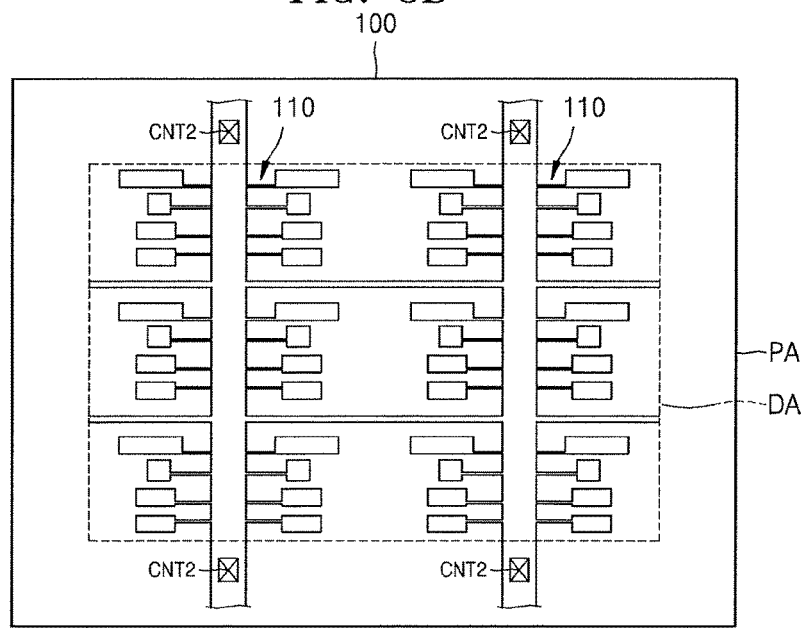

FIGS. 8A and 8B are plan views of a conductive layer over a substrate of an organic light-emitting display device according to another embodiment.

Though a case where the second contact CNT2 between the conductive layer 110 and the opposite electrode 230 described above with reference to FIGS. 5A and 5B has been arranged, one by one, over the plurality of unit pixels PU (see FIGS. 5A and 5B) in the display area DA of the substrate 100, embodiments are not limited thereto. Referring to FIGS. 8A and 8B, the second contact CNT2 between the conductive layer 110 and the opposite electrode 230 may be arranged in a peripheral area PA of the substrate 100.

Figure 9:
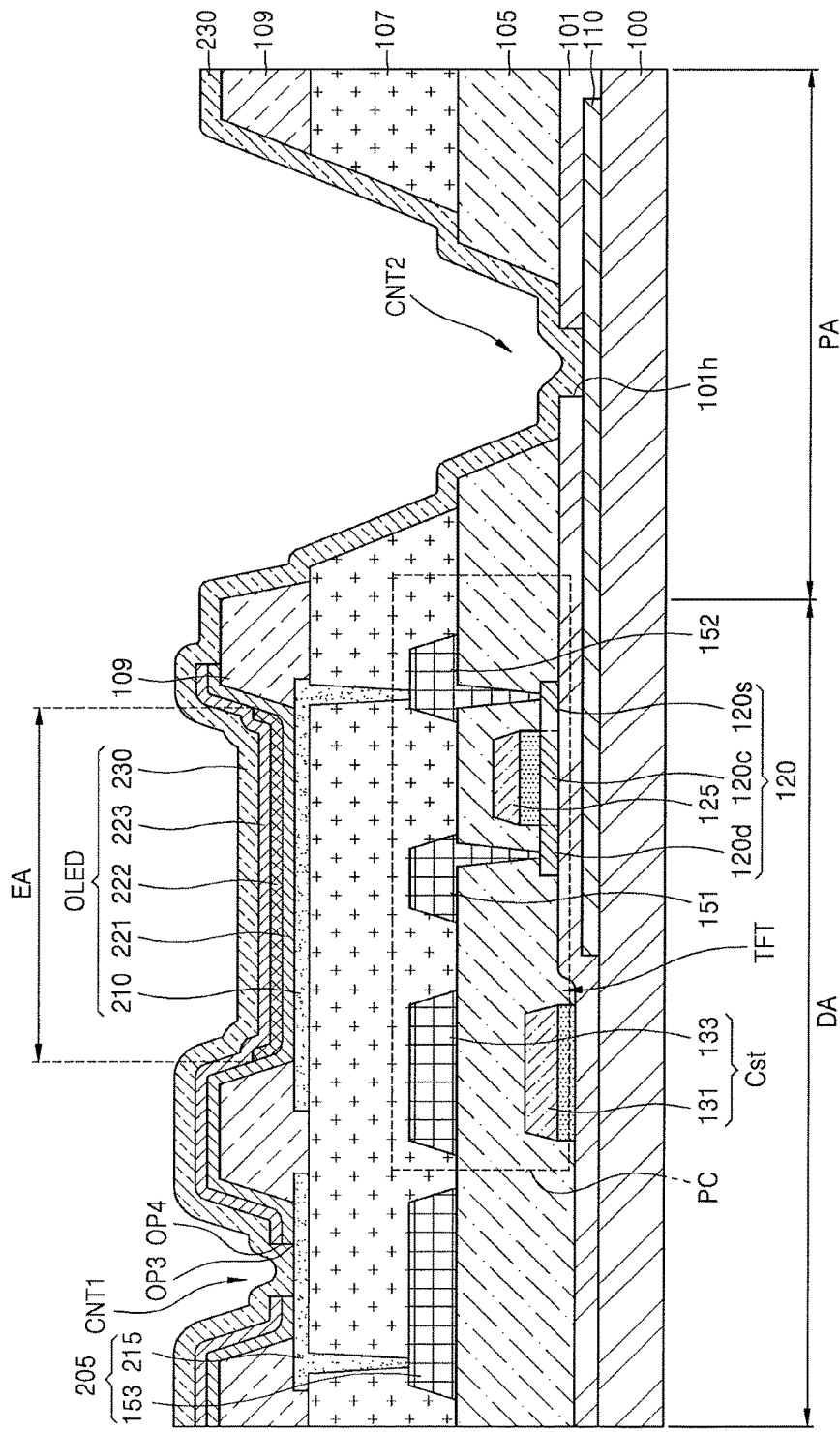
FIG. 9 illustrates a cross-sectional view of an organic light-emitting display device according to another embodiment.

FIG. 9 is a cross-sectional view of an organic light-emitting display device according to another embodiment. When the second contact CNT2 between the conductive layer 110 and the opposite electrode 230 is arranged in the peripheral area PA of the substrate 100 as described above with reference to FIGS. 8A and 8B, the first and second intermediate layers 221 and 222 are not arranged in a region corresponding to the second contact CNT 2 as illustrated in FIG. 9, and the other structures and manufacturing process are substantially the same as those described with reference to FIGS. 4, 6A to 6K.

Employing a TFT using an oxide semiconductor may result in external light penetrating into the TFT, which may change characteristics of the TFT. Therefore, the TFT may include a metallic layer, etc., blocking the external light, but the metallic layer may provide an electrostatic introduction path. Therefore, according to one or more embodiments, the TFT may be prevented from being in a floated state to eliminate the electrostatic induction path. Thus, one or more embodiments may provide an organic light-emitting display device in which light emission stability is high and a manufacturing method thereof may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light-emitting display device, comprising:
   a substrate;
   a thin film transistor over the substrate, the thin film transistor including a semiconductor layer and a gate electrode overlapping the semiconductor layer;
   a conductive layer between the substrate and the semiconductor layer of the thin film transistor;
   an insulating layer between the conductive layer and the semiconductor layer of the thin film transistor;
   a passivation layer covering the thin film transistor;
   a pixel electrode over the passivation layer, the pixel electrode being electrically connected to the thin film transistor via a contact hole defined in the passivation layer;
   an emission layer over the pixel electrode; and
   an opposite electrode over the emission layer, the opposite electrode being electrically connected to the conductive layer,
   wherein the conductive layer is disconnected and physically separated from the semiconductor layer of the thin film transistor by the insulating layer.

2. The organic light-emitting display device as claimed in claim 1, wherein at least a portion of the conductive layer overlaps with a channel region of the semiconductor layer.

3. The organic light-emitting display device as claimed in claim 2, wherein the thin film transistor is a driving thin film transistor.

4. The organic light-emitting display device as claimed in claim 1, wherein the insulating layer includes a hole exposing at least a portion of the conductive layer, and the opposite electrode contacts the conductive layer via the hole.

5. The organic light-emitting display device as claimed in claim 4, further comprising:
a first intermediate layer between the pixel electrode and the emission layer, at least a portion of the first intermediate layer extending to contact the conductive layer and including a first opening corresponding to the hole to allow the opposite electrode to contact the conductive layer via the first opening and the hole.

6. The organic light-emitting display device as claimed in claim 5, wherein a portion of the first intermediate layer that is adjacent to the first opening is a thermally denatured portion.

7. The organic light-emitting display device as claimed in claim 5, wherein a center of the hole coincides with a center of the first opening.

8. The organic light-emitting display device as claimed in claim 5, further comprising:
a second intermediate layer below the opposite electrode, the second intermediate layer covering the first intermediate layer and the emission layer and including a second opening corresponding to the hole to allow the opposite electrode to contact the conductive layer via the second opening, the first opening, and the hole.

9. The organic light-emitting display device as claimed in claim 8, wherein a center of the hole coincides with a center of the second opening.

10. The organic light-emitting display device as claimed in claim 8, wherein a portion of the second intermediate layer that is adjacent to the second opening is a thermally denatured portion.

11. The organic light-emitting display device as claimed in claim 1, wherein the conductive layer includes at least one of a metallic material and a semiconductor material.

12. The organic light-emitting display device as claimed in claim 1, further comprising:
an auxiliary electrode adjacent to the pixel electrode, the auxiliary electrode being electrically connected to the opposite electrode.

13. The organic light-emitting display device as claimed in claim 12, wherein an electric connection region between the opposite electrode and the auxiliary electrode does not overlap an electric connection region between the opposite electrode and the conductive layer.

14. The organic light-emitting display device as claimed in claim 1, further comprising a plurality of pixels, wherein the conductive layer includes portions respectively corresponding to the plurality of pixels and being connected to each other.

15. A method of manufacturing an organic light-emitting display device, the method comprising:
forming a conductive layer;
forming an insulating layer covering the conductive layer;
forming a thin film transistor over the conductive layer, the thin film transistor including a semiconductor layer and a gate electrode overlapping the semiconductor layer;
forming a passivation layer covering the thin film transistor;
forming a pixel electrode over the passivation layer, the pixel electrode being electrically connected to the thin film transistor via a contact hole defined in the passivation layer;
forming a pixel-defining layer covering an edge of the pixel electrode;
forming an emission layer over the pixel electrode;
forming a hole exposing a portion of the conductive layer; and
forming an opposite electrode, the opposite electrode being electrically connected to the conductive layer via the hole and facing the pixel electrode with the emission layer disposed therebetween,
wherein the conductive layer is disconnected and physically separated from the semiconductor layer of the thin film transistor by the insulating layer between the conductive layer and the semiconductor layer of the thin film transistor.

* * * * *